United States Patent [19]

Chang et al.

[11] 4,208,667

[45] Jun. 17, 1980

[54] CONTROLLED ABSORPTION IN HETEROJUNCTION STRUCTURES

[75] Inventors: Leroy L. Chang, Mohegan Lake; Leo Esaki, Chappaqua; George A. Sai-Halasz, Mohegan Lake, all of N.Y.

[73] Assignee: The United States of America as represented by the Secretary of the Army, Washington, D.C.

[21] Appl. No.: 914,101

[22] Filed: Jun. 9, 1978

[51] Int. Cl.² .................................. H01L 29/161
[52] U.S. Cl. .................................... 357/16; 357/17; 357/19; 357/4
[58] Field of Search ................ 357/3, 16, 17, 61, 19, 357/4

[56] References Cited

U.S. PATENT DOCUMENTS

| | | | |
|---|---|---|---|
| 3,626,257 | 12/1971 | Esaki | 317/234 R |
| 3,626,328 | 12/1971 | Esaki | 331/107 G |
| 4,088,515 | 4/1975 | Blakeslee | 148/175 |
| 4,103,312 | 7/1978 | Esaki | 357/16 |
| 4,137,542 | 1/1979 | Esaki | 357/16 |

*Primary Examiner*—Martin H. Edlow
*Attorney, Agent, or Firm*—Nathan Edelberg; Sheldon Kanars; Jeremiah G. Murray

[57] ABSTRACT

A heterojunction structure made of two semiconductor layers is disclosed in which light is applied to the structure and absorbed, and the emission of light from the structure is controlled by an electric field applied perpendicularly to the planes of the layers. It is further disclosed that the device can be employed as a selective light filter or modulator.

3 Claims, 4 Drawing Figures

1

CONTROLLED ABSORPTION IN HETEROJUNCTION STRUCTURES

The invention described herein may be manufactured and used by or for the Government for governmental purposes without the payment of any royalties thereon or therefor.

FIELD OF THE INVENTION

This invention relates to optical devices and particularly to heterojunction semiconductor optical devices.

BACKGROUND OF THE INVENTION

On Dec. 7, 1971, two patents issued to one of the co-inventors hereof, Leo Esaki, such patents being U.S. Pat. Nos. 3,626,257 and 3,626,328 entitled "Semiconductor Device with Superlattice Region" and "Semiconductor Bulk Oscillator", respectively, both of which are incorporated herein by reference. These patents teach how to produce semiconductor devices with superlattice regions, the electrical properties thereof, and point out the prior state of the art with respect to theoretical considerations involving wave propagation in periodic structures, and the bulk negative resistance devices resulting therefrom.

Prior to our invention, Leo Esaki and Raphael Tsu, realized that the normal conduction band energy levels of a superlattice region are modified to produce supplemental allowed levels separated by infrared frequencies in superlattice structures. They taught that such devices could be useful as sources of infrared radiation and as laser amplifiers and oscillators.

It has long been known that GaAs and other alloys of Group III and Group V materials can be employed to emit light either as light emitting diodes or injection lasers. The emission of light in these devices is controlled by the current passed therethrough.

BRIEF DESCRIPTION OF THE INVENTION

It has been found that when light is incident on heterojunction structures having a first semiconductor layer and a second semiconductor layer in which the valance band of the second semiconductor layer is between the valence band and conduction band of the first semiconductor layer, the absorption and transmission characteristics can be controlled by an electric field applied perpendicular to the interface between the first and second layers.

In the preferred embodiment, the first layer is an alloy of GaSb and the second layer is an alloy of InAs. In another preferred embodiment, the first layer is an alloy of GaSbAs and the second layer is an alloy of InGaAs.

According to the present invention, there is provided an optical device comprising a first layer of material having a valence band and a conduction band spaced from the above its valence band, a second layer of material adajcent to the first layer of material and forming an interface therewith and having a valence band and a conduction band spaced from and above its valence band, said second layer valence band being between said first layer valence band and said first layer conduction band, and said second layer conduction band being above said first layer conduction band, means for shining light onto said optical device having a photon energy sufficient to create hole-electron pairs in the optical device, and means for applying a voltage across the first and second layers transverse to said interface to control emission of light from said interface.

DESCRIPTION OF THE DRAWINGS

For a more complete understanding of the invention, reference should be made to the following detailed description of the drawings, in which.

DETAILED DESCRIPTION OF THE INVENTION

Figure 1:
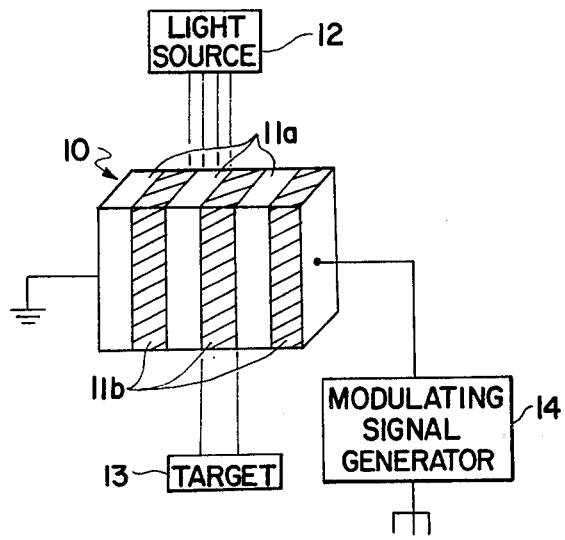
FIG. 1 is a schematic representation showing a heterojunction structure and connected light and voltage applying means in accordance with the teachings of this invention.

Referring now to FIG. 1, we see a heterojunction structure having alternating layers 11a and 11b. The layers 11a are an alloy of InGaAs while the layers 11b are an alloy of GaSbAs. The layers can be "bulk" layers and preferably are grown by molecular beam epitaxy. For a more detailed explanation of the method of manufacturing heterojunction structures such as shown in FIG. 1, reference may be made to the following articles which are incorporated herein by reference, and the references cited therein: InGaAs-GaSbAs. Heterojunctions by Molecular Beam Epitaxy by H. Sakaki, L. L. Chang, R. Ludeke, C. A. Chang, G. A. Sai-Halasz, and L. Esaki; Appl. Phys. Lett. 31, 211 (1977), and MBE of InGaAs and GaSbAs, by C. A. Chang, R. Ludeke, L. Chang, and L. Esaki, Appl. Phys. Lett. 31, 759 (1977).

A light source 12 is mounted to shine light on the edge surfaces of the layers 11a and 11b. Mounted on the opposite side of the heterojunction structure 10 from the light source 12 is a light target 13. The heterojunction structure 10 is situated so that if opaque, it would block the light from the light source 12 while if transparent, it would allow the light from the light source 12 to shine upon the target 13.

The heterojunction structure 10 is connected in a circuit in series with a modulating signal generator 14 which applies voltage thereacross.

Figure 2:
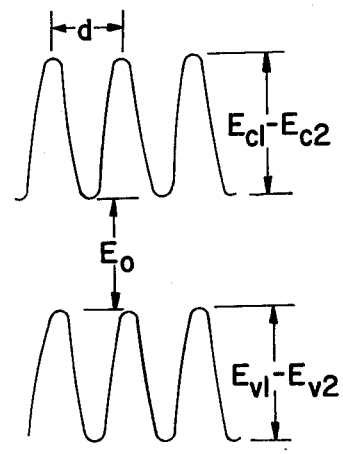
FIG. 2 is an energy level diagram showing the energy levels in the heterojunction structure of FIG. 1 in its quiescent state.

Referring now to FIG. 2, we see the energy level diagram of the heterojunction structure 10 of FIG. 1. The energy levels $E_{ca}$ and $E_{cb}$ of the conduction band of the layers 11a and 11b are seen spaced above the valence bands $E_{va}$ and $E_{vb}$ of the layers 11a and 11b by an amount $E_0$. It is seen from FIG. 2 that without light shining upon the device 10 the valence bands are filled so that no holes appear therein and the conduction bands are empty so that no electrons appear therein.

Figure 3:
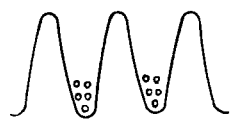
FIG. 3 is an energy level diagram showing the heterojunction structure of FIG. 1 when optically pumped.
Figure 3:
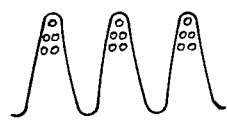

When light from light source 12 shines upon the device 10 of a frequency having sufficient energy to optically pump electrons from the valence bands to the conduction bands, hole-electron pairs are formed in adjacent layers 11a and 11b, see FIG. 3. Thus, electrons are pumped from the valence band of the layers 11a to the conduction band of the layers 11b. In this state, the heterojunction structure 10 absorbs the radiation from the light source 12 and therefore is opaque with respect thereto.

Figure 4:
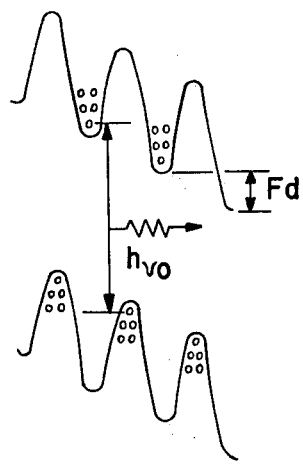
FIG. 4 is an energy level diagram of the heterojunction structure of FIG. 1 when optically pumped and with a transverse voltage applied thereto.

As seen in FIG. 4, with a voltage applied transverse to the interfaces between the layers 11a and 11b, the holes and electrons are moved into the interface and produce radiation by hole electron annihilation. It is noted that the radiation produced is of a lower energy than the pumping energy with a resultant change in frequency. With the voltage applied across the heterojunction device 10, the light from the light source 12 which pumps the heterojunction device 10 produces light on the target 13. As noted above, the light on the target 13 is of a different frequency that produced by the light source 12.

The above described device can be employed as a selective filter of light and as a light modulator. In fact, the frequency response of the heterojunction device 10 is such that with a proper modulating signal generator 14, extremely wide band modulation can be imparted to a light beam.

While this invention has been described with respect to a particular embodiment thereof, numerous others will become obvious to those of ordinary skill in the art in light hereof.

What is claimed is:

1. An optical device comprising: a semiconductor superlattice having two different materials arranged alternately in parallel layers to form a plurality of semiconductor heterojunctions; the bottom of the conduction band of one of said materials being lower than the bottom of the conduction band of the other of said materials to form a series of potential wells and potential barriers; the top of the valance band of said one of said materials being lower than the top of the valance band of said other of said materials to form a series of potential wells and potential barriers; means for directing light onto said optical device with a sufficient energy to create hole-electron pairs in said potential wells; and means for selectively applying a voltage across said layers transverse to the plane of said heterojunctions for selectively causing changes in the spatial separation of said potential wells thereby selectively causing spontaneous recombination of said electrons and holes with a resultant emission of light.

2. An optical device as defined in claim 1, in which said one material is an alloy of GaSb and said other material is an alloy of InAs.

3. An optical device as defined in claim 1, in which said one material is an alloy of GaSbAs and said other material is an alloy of InGaAs.

* * * * *